United States Patent
Fan et al.

(10) Patent No.: US 8,495,536 B2
(45) Date of Patent: Jul. 23, 2013

(54) COMPUTING VALIDATION COVERAGE OF INTEGRATED CIRCUIT MODEL

(75) Inventors: Bo Fan, Beijing (CN); Liang Chen, Shanghai (CN); Yongfeng Pan, Shanghai (CN); Fan Zhou, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/444,094

(22) Filed: Apr. 11, 2012

(65) Prior Publication Data

US 2013/0055179 A1 Feb. 28, 2013

(30) Foreign Application Priority Data

Aug. 31, 2011 (CN) .......................... 2011 1 0270261

(51) Int. Cl.
*G06F 17/50* (2006.01)
(52) U.S. Cl.
USPC .............................. 716/106; 716/136; 703/14
(58) Field of Classification Search
USPC .................................... 716/106, 136; 703/14
See application file for complete search history.

(56) References Cited

U.S. PATENT DOCUMENTS

| | | | |
|---|---|---|---|
| 5,818,850 A | 10/1998 | Tsai et al. | |
| 6,023,568 A * | 2/2000 | Segal | 703/2 |
| 6,263,483 B1 | 7/2001 | Dupenloup | |
| 6,463,560 B1 | 10/2002 | Bhawmik et al. | |
| 6,931,611 B2 * | 8/2005 | Martin et al. | 716/107 |
| 7,092,858 B1 * | 8/2006 | Kukula et al. | 703/2 |
| 7,124,383 B2 * | 10/2006 | Chen et al. | 716/106 |
| 7,290,229 B2 * | 10/2007 | Baumgartner et al. | 716/103 |
| 7,302,624 B2 * | 11/2007 | Rajski et al. | 714/732 |
| 7,401,333 B2 * | 7/2008 | Vandeweerd | 718/102 |
| 7,421,668 B1 | 9/2008 | Ip et al. | |
| 7,454,324 B1 | 11/2008 | Seawright et al. | |
| 7,673,261 B2 * | 3/2010 | Adir et al. | 716/106 |
| 7,725,851 B2 | 5/2010 | Eisner et al. | |
| 7,844,929 B2 | 11/2010 | Chaturvedula et al. | |
| 7,984,403 B2 * | 7/2011 | Oishi et al. | 716/106 |
| 8,032,848 B2 * | 10/2011 | Moon | 716/106 |
| 2004/0243371 A1 | 12/2004 | Gutkovich et al. | |
| 2006/0156145 A1 | 7/2006 | Mitra et al. | |
| 2006/0161828 A1 * | 7/2006 | Lin | 714/738 |
| 2007/0050740 A1 * | 3/2007 | Jacobi et al. | 716/5 |
| 2009/0276741 A1 | 11/2009 | Takayama | |
| 2009/0287965 A1 * | 11/2009 | Oishi et al. | 714/45 |
| 2010/0017760 A1 * | 1/2010 | Kapur et al. | 716/2 |
| 2010/0102825 A1 * | 4/2010 | Bushnell et al. | 324/537 |

FOREIGN PATENT DOCUMENTS

GB 2398901 A 1/2004

* cited by examiner

*Primary Examiner* — Naum Levin
(74) *Attorney, Agent, or Firm* — Yuanmin Cai; Kevin B. Anderson

(57) ABSTRACT

Embodiments of the present invention provide a method of computing validation coverage of an integrated circuit model, comprising: obtaining a logical structure of a integrated circuit model under validation; searching and recording signal paths in the integrated circuit model under validation based on the logical structure; and computing coverage of validation with respect to the signal paths. According to the technical solution as provided in the embodiments of the present invention, a signal path-based validation coverage may be obtained, thereby providing data regarding validation completeness more accurately.

20 Claims, 3 Drawing Sheets

COMPUTING VALIDATION COVERAGE OF INTEGRATED CIRCUIT MODEL

CROSS-REFERENCE TO RELATED APPLICATION

The present application claims the benefit of priority of a Chinese Patent Application Serial Number 201110270261.1, filed Aug. 31, 2011 with the State Intellectual Property Office (SIPO) of the People's Republic of China, the content of which is incorporated herein by reference in its entirety.

TECHNICAL FIELD

The present invention relates to the technology of integrated circuit design, and in particular, relates to a method and apparatus for computing validation coverage of an integrated circuit model.

DESCRIPTION OF THE RELATED ART

In the process of integrated circuit design, validation is a very significant step. In the validation step, various kinds of excitation signals are input to an integrated circuit model, and logical correctness of the integrated circuit model is checked by comparing whether an actual output signal of the integrated circuit model matches the expected output signal. For example, when validating an AND gate model having two input ends, four possible excitation signals are inputted into the model in sequence, and then whether the logic of the AND gate mode is correct is determined by checking whether the output of the AND gate model under each excitation signal is correct. The integrated circuit model needs to be validated before acting as the basis for manufacturing a real integrated circuit.

An objective of the validation step is to guarantee that the integrated circuit model may work properly as designed under all possible excitations. Theoretically, complete validation may be implemented by exhausting various possible excitation signals, thereby guaranteeing the correctness of the integrated circuit model. However, this approach is rather inefficient and has become increasingly impractical as the integrated circuit becomes increasingly complex.

The excitation signals adopted in the actual validation step are a subset of all possible excitation signals. The subset may be manually selected; therefore, it is essential for verifiers to have rich experience. The subset may also be selected by generating random testing instances under constraints. However, no matter what method is adopted, completeness of the validation should be checked, i.e., it should be checked whether all possibilities have been covered by the validation with the subset. Generally speaking, coverage is used to represent the completeness.

A conventional coverage calculating method is based on a Register Transfer Level (RTL) unit. For example, the ratio of validated RTL units to the total RTL units in the integrated circuit model is used to represent the coverage. However, even if individual RTL units may work properly, it does not mean that the integrated circuit model composed of these RTL units can work properly. Therefore, an improved coverage calculating method is desirable.

SUMMARY

Embodiments of the present invention provide a method and apparatus for computing validation coverage of an integrated circuit model.

A method of computing validation coverage of an integrated circuit model according to the embodiments of the present invention comprises: obtaining a logical structure of a integrated circuit model under validation; searching and recording signal paths in the integrated circuit model under validation based on the logical structure; and computing coverage of validation with respect to the signal paths.

An apparatus for computing validation coverage of an integrated circuit model according to the embodiments of the present invention comprises: obtaining a logical structure of a integrated circuit model under validation; searching and recording signal paths in the integrated circuit model under validation based on the logical structure; and computing coverage of validation with respect to the signal paths.

According to the embodiments of the present invention, a signal path-based validation coverage may be obtained. The signal path-based validation coverage may be combined with an RTL unit-based validation coverage to provide validation completeness data more accurately.

DETAILED DESCRIPTION OF PREFERRED EMBODIMENT

Figure 1:
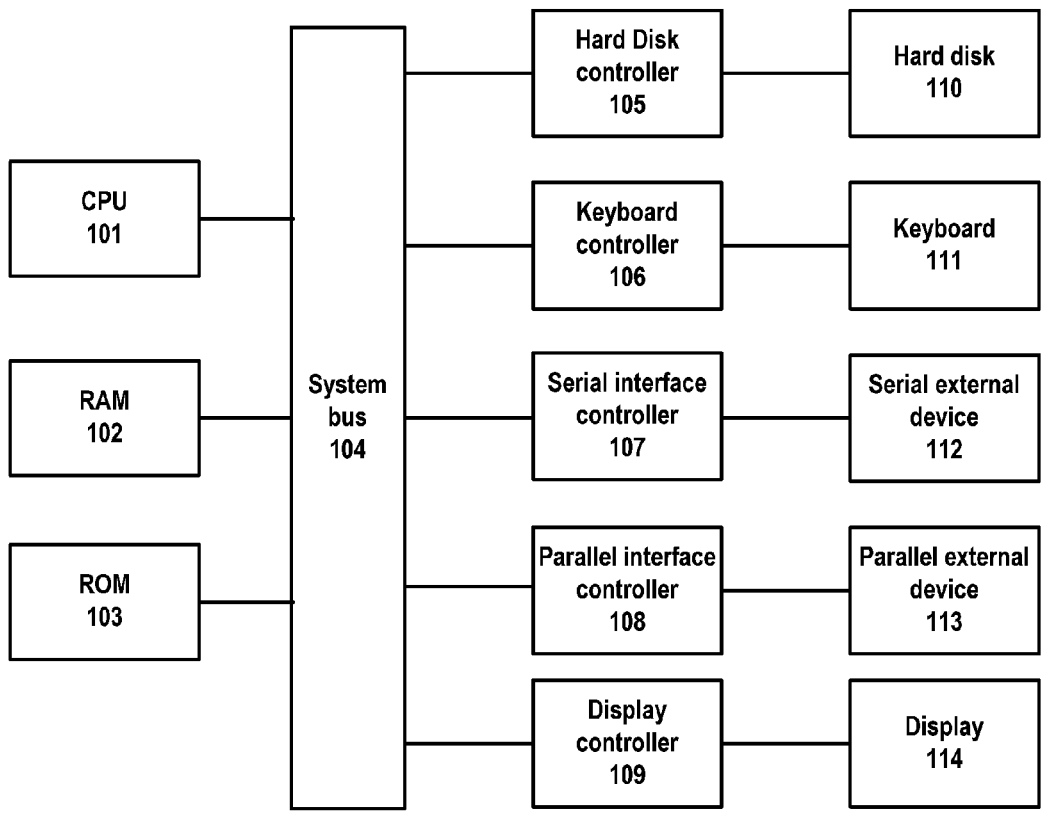
FIG. 1 illustrates a block diagram of an exemplary computing system 100 that is adapted to implement an embodiment of the present invention.

Those skilled in the art would appreciate that various aspects of the present invention may be embodied as an apparatus, a method, or a computer program product. Thus, various embodiments of the present invention may be specifically implemented in the following manners, namely, complete hardware, complete software (including firmware, resident software, microcode, etc), or a combination of software part and hardware part as generally called "circuit," "module," or "system" in this text. Besides, various aspects of the present invention may adopt a manner of computer program product that is embodied in one or more computer readable mediums that comprise computer usable program codes.

Any combination of one or more computer-readable mediums may be used. The computer readable medium may be a computer readable signal medium or computer readable storage medium. The computer-readable medium may be for example, but not limited to, electrical, magnetic, optical, electromagnetic, infrared, or semiconductor system, means, device or a combination of any of the above. More specific examples (non-exhaustive list) of the computer-readable storage medium comprise: an electrical connection having one or more leads, a portable computer magnetic disk, hard disk, random access memory (RAM), read-only memory (ROM), erasable programmable read-only memory (EPROM or flash disk), optical fiber, portable compact disk read-only memory (CD-ROM), optical storage device, a magnetic storage device, or any suitable combination of the above. In the context of this document, the computer readable medium may be any tangible medium that contains or stores a program that is used by an instruction execution system, means or device or used in combination therewith.

A computer-readable signal medium may comprise a data signal contained in a base band or propagated as a part of carrier and embodying propagation of a computer-readable program code. Such propagated signal may employ a plurality of forms, including, but not limited to, electromagnetic signal, optical signal, or any suitable combination thereof. A computer readable signal medium might not be a computer readable storage medium, but any compute readable medium that may send, propagate, or transmit a program that is used by an instruction execution system, means or device or used in combination therewith. A program code that is embodied on the computer-readable medium may be transmitted by any suitable medium, including, but not limited to, radio, wire, cable, or RF, etc, or any suitable combination of the above.

A program code that is embodied on the computer-readable medium may be transmitted by any suitable medium, including, but not limited to, radio, wire, cable, or RF, etc, or any suitable combination of the above.

A computer program code for executing operation of the present invention may be complied by any combination of one or more program design languages, the program design languages including object-oriented program design languages, such as Java, Smalltalk, C++, etc, as well as conventional procedural program design languages, such as "C" program design language or similar program design language. A program code may be completely or partly executed on a user computer, or executed as an independent software package, partly executed on the user computer and partly executed on a remote computer, or completely executed on a remote computer or server. In the latter circumstance, the remote computer may be connected to the user computer through various kinds of networks, including local area network (LAN) or wide area network (WAN), or connected to external computer (for example using an internet service provider via Internet).

Hereinafter, various aspects of the present invention will be described with reference to the method, apparatus (system) and flow chart and/or block diagram of the computer program product according to the embodiments of the present invention. It should be understood that each block in the flow charts and/or block diagrams and combination of each block in the flow charts and/or block diagrams of the present invention may be implemented by computer program instructions. These computer program instructions may be provided to a processor of a utility computer, a dedicated computer or other programmable data processing apparatus, to thereby generating a machine such that these instructions executed through the computer or other programmable data processing apparatus generate means for implementing functions/operations prescribed in the blocks of the flow charts and/or block diagrams.

These computer program instructions may also be stored in a computer-readable medium capable of instructing the computer or other programmable data processing apparatus to work in a particular manner, such that the instructions stored in the computer-readable medium generate an article including instruction means for implementing the functions/operations prescribed in the flow charts and/or block diagrams.

The computer program instructions may also be loaded on a computer or other programmable data processing apparatus, such that a series of operation steps are implemented on the computer or other programmable data processing apparatus, to generate a computer-implemented process, such that execution of the instructions on the computer or other programmable apparatus provides a process of implementing the functions/operations prescribed in the blocks of the flow charts and/or block diagrams.

Hereinafter, the present invention will be described through specific embodiments with reference to the drawings. Such depiction is only for illustration purpose, not intended to limit the scope of the present invention.

FIG. 1 illustrates a block diagram of an exemplary computing system 100 that is adapted to implement the embodiments of the present invention. As illustrated in FIG. 1, the computer system 100 may comprise: a CPU (Central Processing Unit) 101, a RAM (Random Access Memory) 102, a ROM (Read Only Memory) 103, a system bus 104, a hard disk controller 105, a keyboard controller 106, a serial interface controller 107, a parallel interface controller 108, a display controller 109, a hard disk 110, a keyboard 111, a serial peripheral device 112, a parallel peripheral device 113 and a display 114. Among these components, connected to the system bus 104 are the CPU 101, the RAM 102, the ROM 103, the hard disk controller 105, the keyboard controller 106, the serial controller 107, the parallel controller 108, the display controller 109. The hard disk 110 is coupled to the hard disk controller 105; the keyboard 111 is coupled to the keyboard controller 106; the serial peripheral device 112 is coupled to the serial interface controller 107; the parallel peripheral device 113 is coupled to the parallel interface controller 108; and the display 114 is coupled to the display controller 109. It should be understood that the structural block diagram in FIG. 1 is shown only for illustration purpose, and is not intended to limit the scope of the present invention. In some cases, some devices may be added or reduced as required.

As described above, that an isolated RTL unit may work properly does not mean that the integrated circuit model composed of these RTL units can work properly. For example, a designer may miss an RTL unit when designing an integrated circuit model. This RTL unit cannot be called "validated" because it is simply not comprised in the integrated circuit model. However, missing the RTL unit may cause the integrated circuit model as a whole unable to work properly as designed. For another example, suppose two finite state machine RTL units themselves may work properly. If the output of one thereof may be the input of the other thereof, then the correctness of connection relation will influence whether the two RTL units can work properly as a whole, and then further influence the working correctness of other RTL units driven by the two finite state machines.

Figure 2:
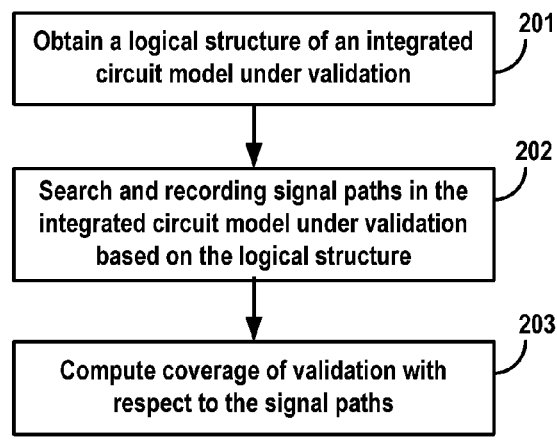
FIG. 2 is a flow chart of a method of computing validation coverage according to embodiments of the present invention.

FIG. 2 is a flow chart of a method of computing validation coverage according to embodiments of the present invention.

At step 201, a logic structure of a integrated circuit model under validation (Design Under Test, DUT) is obtained.

The logical structure as extracted here takes an RTL unit as the basic unit. Extracting RTL units from an integrated circuit model is customary means in the art, which may be implemented by a plurality of synthesis tools; thus, it will not be detailed here. After extracting the RTL units, the connection relation between each RTL unit and other RTL units may be easily obtained, thereby acquiring the logic structure.

A directional graph may be used to express the logical structure. For an integrated circuit design model with an RTL unit as the basic unit, nodes in the corresponding directional graph indicate the RTL units, while the directional edges between nodes indicate signal inputs or outputs between the RTL units. According to one embodiment of the present invention, lines connecting RTL units may also be regarded as nodes in the directional graph, instead of directional edges. With properties being set for respective nodes, the respective nodes may represent different RTL units or lines. Those skilled in the art know how to describe a directional graph through data structures such as adjacency matrix or adjacency table so as to describe the real logical structure. Of course, those skilled in the art may further employ many other means to indicate the logical structure of an integrated circuit model. Thus, acquiring the logical structure of an integrated circuit model just means acquiring a set of data structures indicating the integrated circuit model.

In the subsequent depiction, because of the correspondence relation between the RTL units and directional graph nodes, they refer to equivalent objects.

Step 202, signal paths in the integrated circuit model under validation are searched and recorded according to the logical structure.

At step 201, the RTL units in the integrated circuit model and the connection relation between the RTL units have been obtained. According to the above information, the signal paths in the integrated circuit model may be obtained. The specific step will be illustrated in more detail with reference to another figure.

The basic idea of searching signal paths in the integrated circuit model is to analyze the circuit structure and perform exhaustive search. Because the circuit structure is essentially a directional graph, the exhaustive search must be closed. In other words, the exhaustive search must find all signal paths in the circuit structure.

The signal paths obtained in this step may be recorded with a particular expression manner. Generally, according to one embodiment of the present invention, the signal paths may be recorded with a Generic Coverage Code. According to another embodiment of the present invention, the Generic Coverage Code may be further translated into other language for validation, for example, SVA/PSL/OVA/Wrapper, etc., so as to record the signal paths.

Further, the signal paths may also be filtered according to some constraints. For example, if it would be impossible to adopt a certain branch, the signal paths that comprises this branch may be excluded during recording.

At step 203, coverage of validation with respect to the signal paths is calculated.

After the validation starts, excitation signals are inputted into the integrated circuit model. In this way, it would be very easy to determine which signal paths have been executed due to these excitation signals. The ratio of those executed signal paths to all signal paths may act as the coverage. If the signal paths are filtered at step 202, then the ratio of the executed signal paths to the remaining signal paths after filtering may act as the coverage.

After obtaining the coverage, it may be considered as a reference for evaluating the effect of the validation. If the coverage is lower than a certain threshold, it may be necessary to re-generate excitation signals, then validation is performed again using the re-generated new excitation signals, and then the coverage of the validation with respect to the signal paths is calculated again.

In an exhaustive search, selection of a search start node would influence the amount of computation of the search. Selection of a search start node also influences the efficiency of validation that uses a searched signal path as reference. Thus, selection of the search start node is important.

According to one embodiment of the present invention, an input end of the integrated circuit model acts as the search start node. As above mentioned, the integrated circuit model is essentially a directional graph. For an integrated circuit design model with RTL units as the basic units, the nodes in the directional graph indicate the RTL units, while the directional edges between nodes indicate signal inputs or outputs between the RTL units. An input end of the integrated circuit model or an input node of a corresponding directional graph is an RTL unit that only has an output directional edge(s) without any input directional edge, or its input directional edge(s) comes from outside of the integrated circuit model.

According to another embodiment of the present invention, a finite state machine acts as the search start node. The finite state machine is always a drive for a subsequent circuit, thus efficient validation may also be implemented with the signal paths found with the finite state machine as the search start node.

It is customary means in the art how to identify an input end or finite state machine of the integrated circuit model based on the logical structure of the integrated circuit model, which will not be detailed here.

Figure 3:
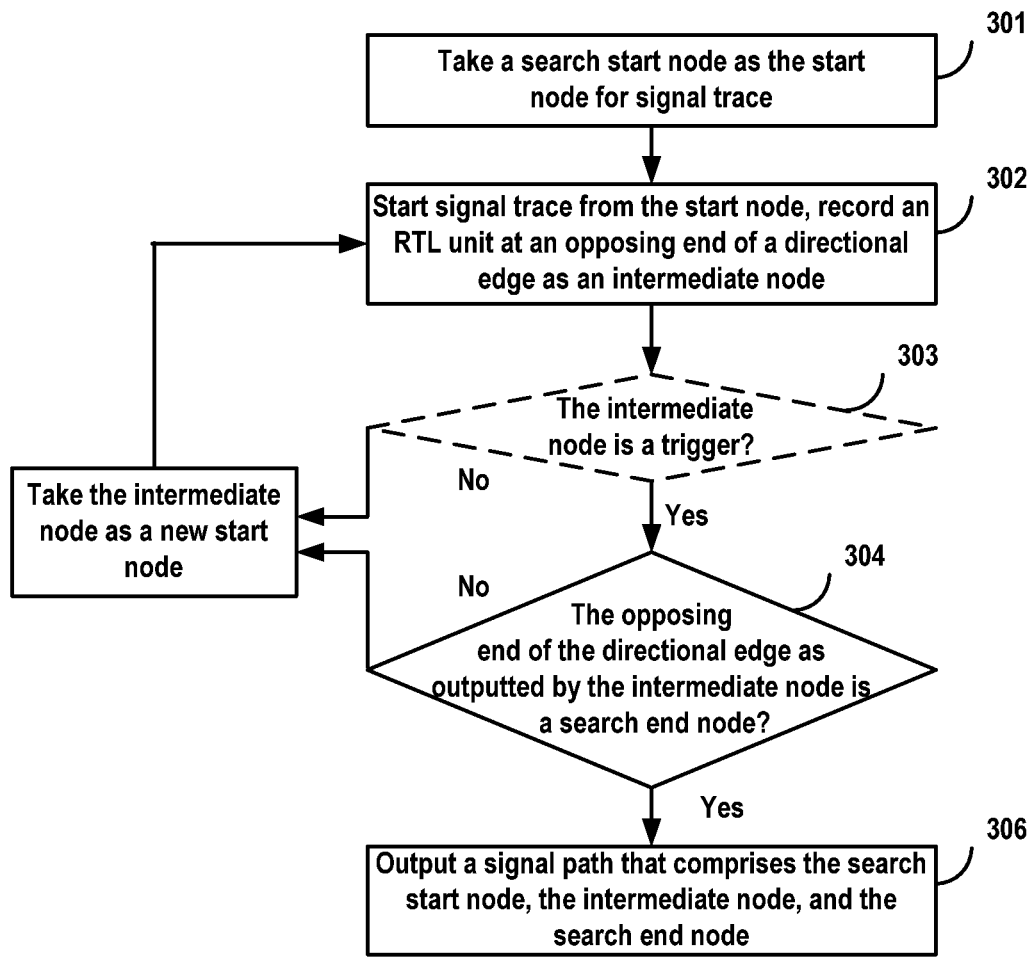
FIG. 3 is a flow chart of how to search and record signal paths.

Hereinafter, how to search and record signal paths in the integrated circuit model will be described with reference to FIG. 3.

At step 301, the search start node acts as the trace source node for a forward signal tracing.

Forward signal tracing means reaching a next RTL unit as the trace sink node along the output directional edge of an RTL unit as the trace source node. The forward signal tracing merely involves two RTL units, i.e., the RTL units at two ends of the directional edge. As mentioned above, the search start node is also an RTL unit and thus may act as the trace source node. The reverse signal tracing to be mentioned below means reaching an RTL unit as the trace sink node along an input directional edge of an RTL unit as the trace source node. The reverse signal tracing also merely involves two RTL units, i.e., the RTL units at two ends of the directional edge.

At step 302, a forward signal tracing is performed from the trace source node, and the trace sink node at an opposing end of the directional edge is recorded as an intermediate node.

At step 303, it is determined whether the intermediate node is a trigger; if yes, the method proceeds to step 304; otherwise, it proceeds to step 305.

The step 303 is optional. Without step 303, the method directly proceeds from step 302 to step 304.

At step 304, forward signal tracing starts from the intermediate node, and it is determined whether the trace sink node at the opposing end of the directional edge is a search end node; if yes, then the method proceeds to step 306; otherwise, the method proceeds to step 305.

The search end node may be the output end of the integrated circuit model or a node providing input to the finite state machine inside the integrated circuit model. According to the nature of the digital circuit itself, the search end node is generally required to have a stable output. Thus, a trigger often exists before the search end node on a signal path. Before determining whether an RTL unit is the search end node, i.e., step 304, it is first determined whether a corresponding trigger exists, such that the accuracy of identifying the search end node may be improved. Meanwhile, because identifying a trigger is much easier than identifying the search end node, it may also avoid determination of whether it is a search end node for each intermediate node.

At step 305, the intermediate node acts as the new trace source node; and the method returns to step 302.

At step 306, a signal path comprising the search start node, the intermediate node, and the search end node is outputted.

According to one embodiment of the present invention, the number of the intermediate nodes are recorded at step 302. The number of intermediate nodes indicate the length of the path. The longer the path is, the more the excitation signals required for validating the path are. The overall validation efficiency will be dampened if too many excitation signals are adopted to verify an over long path. In particular, the number of triggers may also be recorded at step 303. Existence of triggers indicates to a greater extent increase of the number of excitation signals required for validation.

It may be determined during the processing of search signal paths whether the number of intermediate nodes or the number of triggers through which a path goes exceeds the threshold of the number of intermediate nodes or the threshold of the number of triggers, such that once it exceeds, further forward signal tracing will be ceased, without recording the signal path. Determination of the signal path length may not be conducted during the search process; instead, all searched signal paths will be recorded, and then the recorded paths are filtered with the number of intermediate nodes or the number of triggers as the constraint.

A trace source node may output a plurality of directional edges, and the opposing end of each directional edge has a trace sink node. The plurality of directional edges correspond to different paths, respectively. A flag bit may be set in a data structure representing a node so as to facilitate searching all these different paths. Before searching, the flag bits of all nodes are reset to a default value, for example, 0. Before starting each forward signal tracing, it is determined whether the flag bits of trace sink nodes at the opposing end of respective directional edges as outputted from the current trace source node are a non-default value, for example 1. If yes, the flag bits of the trace source nodes are set as the default value, and the method returns to step 301, namely, starting the forward signal tracing again from the search start node. Otherwise, if one or more flag bits in the trace sink nodes at the opposing end of respective directional edges as outputted from the current trace source are default values, then the forward signal tracing reaches one of the trace sink nodes whose flag bit is the default value. Those skilled in the art may also design various other approaches to guarantee finding all signal paths starting from the same search start node.

In the above description, suppose the signal path is a "direct connection path," i.e., no combinational logic RTL unit on the signal path. Output of the combinational logic RTL unit is determined by a plurality of inputs. The basic combinational logic RTL unit comprise various kinds of logical gates such as AND gate, OR gate, and a multiplexer (MUX), a comparator. A complex combinational logic circuit, for example, an adder, a multiplier, may be decomposed into a combination of basic combinational logic RTL units. The signal path comprising the combinational logic RTL units is called "a combinational logic path." The signal from the search end node in the combinational logic path always depends on a plurality of signals of the search start node.

According to one embodiment of the present invention, a reverse signal tracing is adopted to determine respective search start nodes of the combinational logic paths. In brief, if a combinational logic RTL unit is detected during forward signal tracing, then besides taking the combinational logic RTL unit as the new trace source node to continue the forward signal tracing, the reverse signal tracing may also be performed with the combinational logic RTL unit as the trace sink node, so as to find all search start nodes that influence the output of the combinational logic RTL unit. As previously mentioned, the signal in the integrated circuit model either comes from the input end or from the finite state machine; thus the reverse signal tracing will finally arrive at one of the two types of RTL units.

Figure 4A:
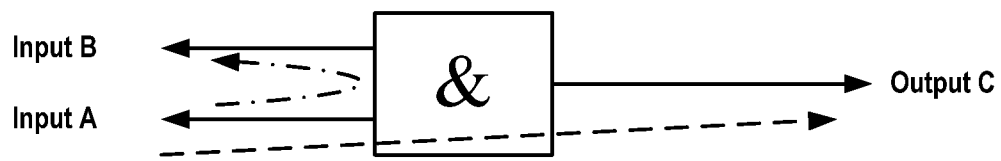
FIGS. 4A and 4B illustrate a forward signal tracing and a reverse signal tracing.

FIG. 4A illustrates a forward signal tracing and a reverse signal tracing with an AND gate as an example. The forward signal tracing is indicated by a dotted line, while the reverse signal tracing is indicated by a chain line. The forward signal tracing arrives at the AND gate as the trace sink node along the indication of the directional edge Input A. Next, on one hand, the next forward signal tracing is conducted with the AND gate as a new trace source node along the directional edge Output C; on the other hand, the reverse signal tracing is conducted along another directional edge Input B that is inputted to the AND gate. The forward signal tracing will arrive at the search end node, while the reverse signal tracing will arrive at another search start node.

Figure 4B:
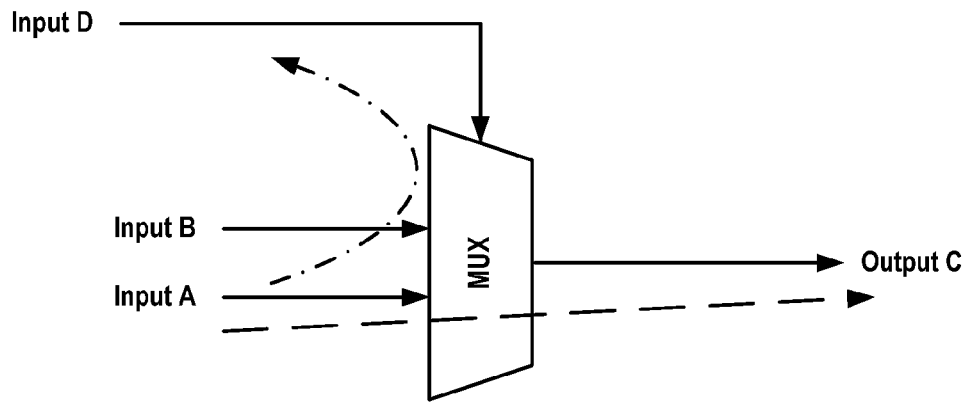

FIG. 4B illustrates a forward signal tracing and a reverse signal tracing with a multiplexer as an example. For a multiplexer, a control signal along the directional edge Input D determines whether the signal along the directional edge Input A may pass through the multiplexer, thus, preferably, the reverse signal tracing can be conducted along the directional edge Input D.

Figure 5:
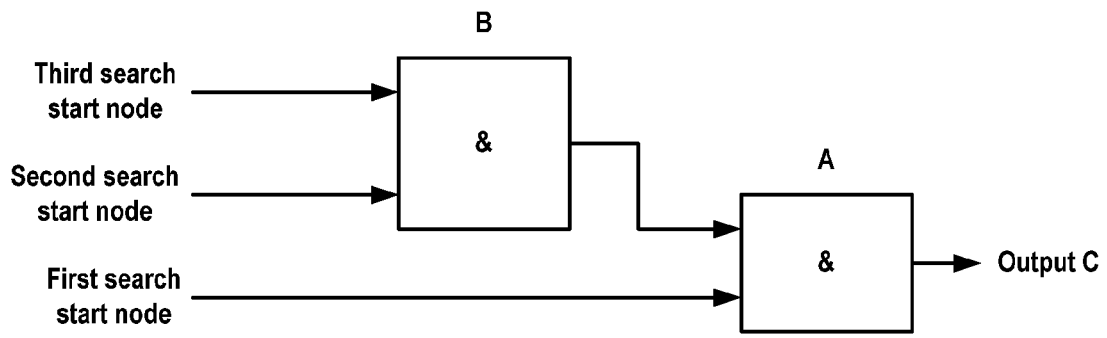
FIG. 5 is a combinational logic circuit.

The RTL units found by the reverse signal tracing may possibly be combinational logic RTL units. All search start nodes may be found by adopting the depth-first or width-first algorithm. Hereinafter, the step of finding all search start nodes by using the depth-first algorithm will be illustrated with reference to FIG. 5.

First, AND gate A is reached from a first search start node through forward signal tracing. Because the AND gate A is a combinational logic RTL unit, it is necessary to perform reverse signal tracing.

Second, reverse signal tracing is performed with AND gate A as the trace sink node, and AND gate B is reached. AND gate B is also a combinational logic RTL unit; thus, it has a plurality of input directional edges. The AND gate B is recorded.

Third, reverse signal tracing is performed with AND gate B as the trace sink node; a second search start node is reached along an input directional edge of AND gate B.

Fourth, returning to AND gate B, the second reverse signal tracing is performed with AND gate B as the trace sink node, and along the other input directional edge of AND gate B, the third search start node is reached.

Fifth, because reverse signal tracing has been performed to each directional edge of the AND gate B, the AND gate B has been processed completely. Further, because each input directional edge of AND gate A has been processed completely, each search start node that influences the output of AND gate A has been found.

Through combining the forward signal tracing and the reverse signal tracing, such signal path may be obtained as comprising: at least one search end node, a search start node that influences a signal of the search end node, and an intermediate node between the search start node and the search end node. Upon validation, it would be easy to determine whether the path has been executed, thereby obtaining a coverage with a signal path as reference.

Figure 6:
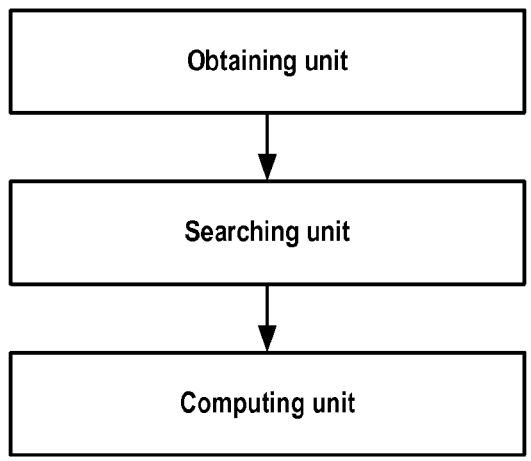
FIG. 6 is a block diagram of an apparatus for computing validation coverage according to an embodiment of the present invention.

FIG. 6 is an apparatus for computing validation coverage of an integrated circuit model according to the embodiments of the present invention. The apparatus comprises:

obtaining means configured to obtain a logical structure of a integrated circuit model under validation;

searching means configured to search and record signal paths in the integrated circuit model under validation according to the logical structure.

computing means configured to compute coverage of the validation with respect to the signal paths.

The flowcharts and block in the figures illustrate the system, methods, as well as architecture, functions and operations executable by a computer program product according to the embodiments of the present invention. In this regard, each block in the flowcharts or block may represent a module, a program segment, or a part of code, which contains one or more executable instructions for performing specified logic functions. It should be noted that in some alternative implementations, functions indicated in blocks may occur in an order differing from the order as shown in the figures. For example, two blocks shown consecutively may be performed in parallel substantially or in an inverse order. This depends on relevant functions. It should also be noted that each block in the block diagrams and/or flowcharts and a combination of blocks in the block diagrams and/or flowcharts may be implemented by a dedicated hardware-based system for performing specified functions or operations or by a combination of dedicated hardware and computer instructions.

Although the apparatus and method according to the present invention has been described in detail with reference to preferred embodiments, the present invention is not limited thereto. A person of normal skill in the art can make various changes, alterations and modifications to the present invention under the teaching of the description without departing from the spirit and scope of the present invention It should be understood that all such changes, alterations, and modifications still fall into the protection scope of the present invention. The protection scope of the present invention is defined by the appending claims.

The invention claimed is:

1. A method of computing validation coverage of an integrated circuit model, the method comprising:
   obtaining a logical structure of an integrated circuit model under validation, wherein the logical structure is represented by a directional graph having nodes corresponding to register transfer level (RTL) units of the integrated circuit model;
   searching and recording signal paths in the integrated circuit model under validation based on the logical structure; and
   computing validation coverage with respect to the signal paths,
   wherein one of the above steps is performed on a computer.

2. The method according to claim 1, wherein searching and recording signal paths in the integrated circuit model under validation comprises:
   taking a search start node as a trace source node for a forward signal tracing;
   starting the forward signal tracing from the trace source node;
   recording a trace sink node, which is at an opposing end of a directional edge and opposing the trace source node, as an intermediate node;
   determining whether a search end node is found;
   performing, if the search end node is not found, the forward signal tracing with the intermediate node as a new trace source node, and returning to the step of recording; and
   recording, if the search end node is found, a signal path comprising the search start node, the intermediate node, and the search end node.

3. The method according to claim 2, wherein the search start node is one of the following nodes of an input end of the integrated circuit model and a finite state machine.

4. The method according to claim 2, wherein the search end node is one of the following nodes of an output end of the integrated circuit model and a node providing input to a finite state machine.

5. The method according to claim 2, wherein determining whether the search end node is found comprises:
   determining whether the intermediate node is a trigger;
   determining that no search end node is found if the intermediate node is not a trigger; and
   performing, if the intermediate node is a trigger, the forward signal tracing with the trigger as a new trace source node, and determining whether a new trace sink node, which is at an opposing end of a new directional edge and opposing the new trace source node, is the search end node.

6. The method according to claim 2, further comprising:
   starting, if the intermediate node is a combinational logic circuit, a reverse signal tracing from the combinational logic circuit, till finding all search start nodes that influence output of the combinational logic circuit.

7. The method according to claim 1, wherein searching and recording signal paths in the integrated circuit model under validation comprises:
   recording a signal path that have a length less than a threshold in the integrated circuit model under validation.

8. The method according to claim 7, wherein the length of the signal path is indicated by a number of triggers through which the signal path goes.

9. An apparatus for computing validation coverage of an integrated circuit model, the apparatus comprising:
   obtaining means configured to obtain a logical structure of a integrated circuit model under validation, wherein the logical structure is represented by a directional graph having nodes corresponding to register transfer level (RTL) units of the integrated circuit model;
   searching means configured to search and record signal paths in the integrated circuit model under validation according to the logical structure,
   computing means configured to compute validation coverage of the signal paths.

10. The apparatus according to claim 9, wherein the searching means comprises:
    means configured to take a search start node as a trace source node for a forward signal tracing;
    means configured to start the forward signal tracing from the trace source node;
    means configured to record a trace sink node, which is at an end of a directional edge and opposing the trace source node, as an intermediate node;
    means configured to determine whether a search end node is found;
    means configured to perform, if no search end node is found, the forward signal tracing with the intermediate node as a new trace source node, and trigger the means configured to record a new trace sink node, which is at an opposing end of a new directional edge and opposing the new trace source node, as a new intermediate node; and
    means configured to record, if the search end node is found, a signal path comprising the search start node, the intermediate node, and the search end node.

11. The apparatus according to claim 10, wherein the search start node is one of the following nodes of an input end of the integrated circuit model, and a finite state machine.

12. The apparatus according to claim 10, wherein the search end node is one of the following nodes of an output end of the integrated circuit model, and a node providing input to a finite state machine.

13. The apparatus according to claim 10, wherein the means configured to determine whether the search end node is found comprises:
    means configured to determine whether the intermediate node is a trigger;
    means configured to determine that no search end node is found if the intermediate node is not a trigger; and
    means configured to perform, if the intermediate node is a trigger, the forward signal tracing with the trigger as a new trace source node, and determine whether a new trace sink node, which is at an opposing end of a new directional edge and opposing the new trace source node, is the search end node.

14. The apparatus according to claim 10, further comprising:
means configured to start, if the intermediate node is a combinational logic circuit, a reverse signal tracing from the combinational logic circuit, till finding all search start nodes that influence output of the combinational logic circuit.

15. The apparatus according to claim 9, wherein the searching means comprises:
means configured to record a signal path that has a length less than the threshold in the integrated circuit model under validation.

16. The apparatus according to claim 15, wherein the length of the signal path is indicated by a number of triggers through which the signal path goes.

17. A computer readable storage medium having stored thereon a set of instructions that, when executed by a machine, results in
obtaining a logical structure of an integrated circuit model under validation, wherein the logical structure is represented by a directional graph having nodes corresponding to register transfer level (RTL) units of the integrated circuit model;
searching and recording signal paths in the integrated circuit model under validation based on the logical structure; and
computing validation coverage with respect to the signal paths.

18. The computer readable storage medium of claim 17, wherein in searching and recording signal paths in the integrated circuit model under validation, the set of instructions results in:
taking a search start node as a trace source node for a forward signal tracing;
starting the forward signal tracing from the trace source node;
recording a trace sink node, which is at an opposing end of a directional edge and opposing the trace source node, as an intermediate node;
determining whether a search end node is found;
performing, if the search end node is not found, the forward signal tracing with the intermediate node as a new trace source node, and returning to the step of recording; and
recording, if the search end node is found, a signal path comprising the search start node, the intermediate node, and the search end node.

19. The computer readable storage medium of claim 17, wherein in determining whether the search end node is found, the set of instructions results in:
determining whether the intermediate node is a trigger;
determining that no search end node is found if the intermediate node is not a trigger; and
performing, if the intermediate node is a trigger, the forward signal tracing with the trigger as a new trace source node, and determining whether a new trace sink node, which is at an opposing end of a new directional edge and opposing the new trace source node, is the search end node.

20. The computer readable storage medium of claim 17, wherein the set of instructions further results in:
starting, if the intermediate node is a combinational logic circuit, a reverse signal tracing from the combinational logic circuit, till finding all search start nodes that influence output of the combinational logic circuit.

* * * * *